United States Patent [19]

Stow

[11] Patent Number: 4,880,683

[45] Date of Patent: Nov. 14, 1989

[54] HOT-TACKIFYING ADHESIVE TAPE

[75] Inventor: Robert H. Stow, St. Paul, Minn.

[73] Assignee: Minnesota Mining and Manufacturing Company, St. Paul, Minn.

[21] Appl. No.: 192,486

[22] Filed: May 11, 1988

Related U.S. Application Data

[63] Continuation-in-part of Ser. No. 89,678, Aug. 26, 1987, abandoned, which is a continuation-in-part of Ser. No. 445,864, Dec. 6, 1982, abandoned, which is a continuation-in-part of Ser. No. 334,820, Dec. 28, 1981, abandoned.

[51] Int. Cl.$^4$ .................. B32B 3/12; B32B 7/10; B32B 15/08; C09J 7/02
[52] U.S. Cl. .................. 428/200; 428/209; 428/214; 428/261; 428/290; 428/347; 428/349; 428/352; 428/354; 428/355; 428/463; 428/906; 428/913; 428/914
[58] Field of Search .............. 428/355, 328, 349, 352, 428/347, 354, 200, 209, 214, 290, 463, 913, 914, 906, 261; 525/203

[56] References Cited

U.S. PATENT DOCUMENTS

| | | | |
|---|---|---|---|
| 3,475,213 | 10/1969 | Stow | 428/328 |
| 3,718,495 | 2/1973 | Tomita | 428/355 |
| 4,045,517 | 8/1977 | Guerin et al. | 525/203 |
| 4,199,646 | 4/1980 | Hori et al. | 428/355 X |

Primary Examiner—Thomas J. Herbert
Attorney, Agent, or Firm—Donald M. Sell; Walter N. Kirn; Gerald F. Chernivec

[57] ABSTRACT

Hot-tackifying adhesive tape, the adhesive layer of which is an acrylic polymer which is nontacky or poorly tacky at ordinary room temperature, but at any temperature over a wide range of elevated temperatures, it becomes tacky and adheres upon contact to clean substrates without the application of significant pressure. Good bonds are immediately formed at a tackifying temperature without the necessity of crosslinking or other chemical reactions.

21 Claims, 2 Drawing Sheets

FIG. 7

HOT-TACKIFYING ADHESIVE TAPE

CROSS REFERENCE TO RELATED APPLICATION

This application is a continuation-in-part of applicant's copending application Ser. No. 089,678, filed Aug. 26, 1987, now abandoned which is a continuation in-part of Pat. application Ser. No. 445,864, filed Dec. 6, 1982, now abandoned, which is a continuation-in-part of Pat. application Ser. No. 334,820, filed Dec. 28, 1981, now abandoned.

TECHNICAL FIELD

The invention concerns a heat-activatable adhesive tape that is wound upon itself in roll form for convenience in storage and use and is especially concerned with tapes having adhesive layers which contain electrically-conductive particles.

BACKGROUND ART

The adhesive layer of almost every heat-activatable adhesive tape now on the market has a rather narrow melting point range. Such a tape is called a "hot-melt" adhesive tape, because its adhesive layer is melted at the bonding temperature. At temperatures within 10° C. below the bonding temperature, the adhesive may not even be tacky. Because the adhesive has virtually no strength at the bonding temperature, a clamp may be used until a strong bond develops, either by cooling or by curing. If the bond is later heated to a temperature at or above the bonding temperature, the bond fails unless the adhesive has become cured, e.g., by crosslinking. If the adhesive becomes cured when heated, the tape tends to have a limited shelf life, especially if stored in ordinary warehouses which may become quite hot during the day.

Pressure-sensitive adhesive tapes can be formulated to provide immediate bonding strength, usually called "wet-grab". Bonds tend to retain good strength at moderately elevated temperatures, but may weaken to the point of failure at higher temperatures. One such tape has a heat-shrinkable backing as disclosed in U.S. Pat. No. 3,718,495 (Tomita). After being wound upon an object as a protective covering, heat is applied to cause the backing to shrink tightly around the object. However, its adhesive layer may become so soft upon further heating that the outermost wrap may become loose.

U.S. Pat. No. 3,475,213 (Stow) discloses a pressure-sensitive adhesive tape having an electrically-conductive backing and an adhesive layer containing electrically-conductive metal particles which preferably are flattened. When applied to electrical conductors such as are on one face of a printed circuit board, the particles conduct electricity between the conductors and the backing. Under conditions encountered in use, the particles tend to move about, gradually resulting in increased electrical resistance unless the assembly has a permanent clamp, but this is expensive.

U.S. Pat. No. 4,199,646 (Hori et al.) discloses tapes which are heat activatable and pressure sensitive at room temperature. The adhesives utilized therein are a mixture of acrylate copolymers with monomers containing functional groups and a compatible reactive resin. The heat activatable condition of Hori et al means that heat causes the reactive groups of the acrylate to react with those of the reactive resin, resulting in firming and crosslinking of the adhesive composition, i.e., thermosetting. Tapes according to the present invention do not contain a reactive resin and are substantially non-crosslinkable and substantially non-thermosettable.

U.S. Pat. No. 4,045,517 (Guerin et al.) discloses polyacrylic hot melt adhesives prepared by blending a soft part "A", an acrylate polymer having $T_g$'s between −85° and 0° C., and a firm part "B", an acrylate polymer having $T_g$'s between 20° and 150° C. From the disclosure one can conclude that the adhesives are pressure sensitive at ordinary room temperature. Forming a single polymer from the ratios of monomers in Guerin et al affords very poor, if not totally unsuitable, hot melt adhesives. This is contrary to the present invention wherein a single acrylate polymer within the claimed range of $T_g$ can be utilized.

Shear value data presented in Table I herein confirms that tapes according to the present invention are substantially non-crosslinkable and substantially non-thermosettable. This data also illustrates the superior performance of adhesives according to the present invention over those of Hori et al and Guerin et al.

DISCLOSURE OF THE INVENTION

The invention concerns a heat-activatable adhesive tape that can be wound upon itself in roll form for convenience in storage and use and is nontacky or poorly tacky at ordinary room temperature (20° C.) but differs from heat-activatable adhesive tapes of the prior art in that its adhesive layer becomes pressure-sensitive and aggressively tacky when heated. Good bonds are immediately formed at a tackifying temperature without any need for crosslinking or other chemical reactions, i.e., the system is substantially non-crosslinkable and non-thermosettable. Hence, the novel tape may be called a "hot-tackifying" adhesive tape.

As used herein, "substantially non-crosslinkable" and "substantially non-thermosettable" are interchangeable terms and have the following meanings:

The adhesive composition of the present invention becomes firmer during drying at 104° C. for 3 minutes as shown by 65° C. shear value; however, the 130° C. Shear Value for the adhesive composition does not increase upon further heating for 1 or 2 hours at 130° C. Even after heating for 2 hours at 130° C., tapes according to the present invention do not pass 130° C. shear for 16 hours (960 minutes) as themosettting adhesives characteristically do.

The hot-tackifying tape of the invention can be shipped and stored in commerce and later put to use with the same effect as freshly prepared tape. When later subjected to temperatures at or even above the bonding temperature, adequate bond strength may be retained. Because of this, the novel tape is particularly useful in the tape forms disclosed in the aforementioned Tomita and Stow patents and the below-mentioned Olyphant Pat. No. 3,497,383. When the novel tape has a form as disclosed in the Stow Pat., the electrically-conductive particles tend to remain in place, and the adhesive is resistant to flow between the particles and the electrical conductors with which they are in adhesive contact, even at elevated temperatures. In such form, the electrically-conductive particles may comprise from 0.1 to 40 volume percent of the adhesive layer.

Like heat-activatable adhesive tapes of the prior art, the hot-tackifying tape of the invention has a flexible, heat-resistant backing. To illustrate, the backing may be a plastic film which may be heat-shrinkable in the lengthwise direction, a conductive metal foil such as copper or aluminum, or a fibrous web such as woven glass fibers. The adhesive layer may incorporate lineally-aligned reinforcing filaments or may contain short, randomly-intermingled fibers or other reinforcing material. Like many adhesive tapes of the prior art, the adhesive layer of the novel tape comprises an acrylic polymer of at least one alkyl acrylate and/or methacrylate ester monomer (here called "acrylic ester monomer") such as ethyl acrylate.

As in the prior art, better cohesive and adhesive strengths are attainable if the adhesive layer comprises an acrylic copolymer of acrylic ester monomer and at least one copolymerizable monomer having a polar group. Other copolymerizable monomers may also be employed in various amounts without detracting from the value of the acrylic copolymer for the purposes of the invention. Among such copolymerizable monomers are styrene, vinyl acetate and vinyl chloride, which when used are preferably used in amounts up to 5 mol percent of the total monomers.

The adhesive layer of the hot-tackifying tape of the invention differs from adhesive layers of the prior heat-activatable tapes in that it is substantially non-crosslinkable or non-thermosettable and:

(1) acrylic ester monomer provides at least 50 mol percent of the acrylic polymer of the adhesive layer, (2) said acrylic polymer has a Tg (glass transition temperature) or a weight-averaged Tg of −10° to 80° C., (3) said adhesive layer has a Shear Value (as defined below) of at least 25 minutes of 65° C., and (4) up to 50 mol percent of the acrylic polymer can be provided by copolymerizable monomer having a polar group, such as acrylic acid, methacrylic acid, itaconic acid, maleic acid or anhydride, the amides of said acids, acrylonitrile, methacrylonitrile, and N-vinyl-2-pyrrolidone.

The acrylic polymer may be a homopolymer of an acrylic ester monomer which provides a Tg within the range of −10° to 80° C., e.g., methyl acrylate, or a copolymer of acrylic ester monomer and copolymerizable polar monomer having a Tg within that range. Useful acrylic ester monomers which homopolymerize to a Tg of at least −10° C. include methyl acrylate, methyl methacrylate, ethyl methacrylate, propyl methacrylates, butyl methacrylates, bornyl acrylates, bornyl methacrylates, 2-phenoxyethyl acrylate, 2-phenoxyethyl methacrylate, the mono- and di-methyl and ethyl esters of itaconic acid, and the mono- and di-methyl and ethyl esters of maleic acid. Useful acrylic ester monomers which provide reduced Tg include ethyl, butyl, and octyl acrylates, and n-amyl, hexyl and octyl methacrylates. A copolymer of 43 mol percent of methyl methacrylate, 53 mol percent of methyl acrylate and 4 mol percent of acrylamide had a weight-averaged Tg of about 50° C. A copolymer of 73 mol percent of methyl methacrylate, 19 mol percent of methyl acrylate, 4 mol percent of ethyl acrylate, and 4 mol percent of acrylamide had a weightaveraged Tg of about 79° C.

If the Tg or weight-averaged Tg were below -10° C., the adhesive layer might not form bonds having desirable high strength at elevated temperatures, but if above 80° C., bonding temperatures might be undesirably high and the bonds might be unduly brittle at cold temperatures. When heated about 50° C. above its Tg or weight-averaged Tg, the adhesive layer becomes sufficiently tacky to form useful bonds with applied pressure.

The bond-making ability of the hot-tackifying tape can be measured in terms of "shear creep compliance" as in U.S. Pat. No. 3,790,439 (LaPerre et al). At ordinary room temperature, the tape has a 10-second shear creep compliance of less than about $0.5 \times 10^{-6}$ cm$^2$/dyne and is too firm to flow out and wet a smooth substrate to form a good bond. At the bonding temperature, the 10-second shear creep compliance should exceed about $1 \times 10^{-6}$ cm$^2$/dyne, above which the adhesive will be soft enough to flow out and wet a smooth substrate to form a good bond.

Brief Description of The Drawing

In the drawing which schematically illustrates a number of tapes embodying the invention.

Figure 1:
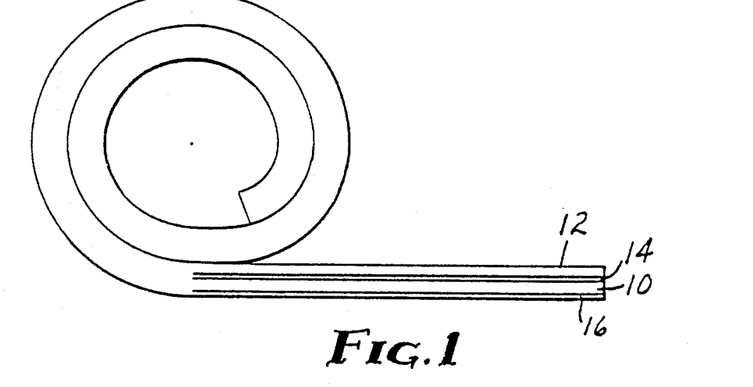
FIG. 1 shows a roll of one embodiment and an edge of an unwound portion.

The tape of FIG. 1 has a backing 10, a hot-tackifying adhesive layer 12, an adhesion-promoting primer coating 14, and a low-adhesion backsize coating 16. The backing 10 may be a plastic film which may be heat-shrinkable or may be paper. If the backing had a release surface or layer instead of the primer coating 14, the adhesive layer 12 could be removed from the backing for use as a transfer adhesive.

Figure 2:
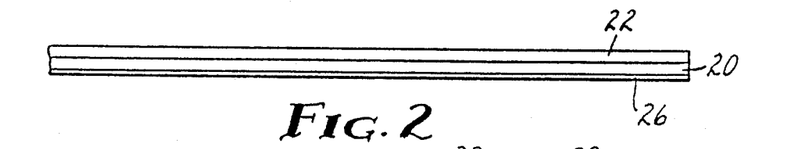
FIG. 2 is an edge view of a second embodiment.

The tape of FIG. 2 has a fibrous backing 20 such as paper, cloth or a carded, heat-fused web and a hot-tackifying adhesive layer 22 directly in contact with the backing. Because of the fibrous nature of the backing 20, the adhesive may become mechanically interlocked into interstices of one face of the backing, so that no adhesion-promoting primer layer is necesary. However, a low-adhesion backsize coating 26 (or a disposable liner, not shown) prevents the adhesive layer 22 from becoming mechanically interlocked with the other face of the fibrous backing 20 when the tape is wound upon itself into roll form.

Figure 3:
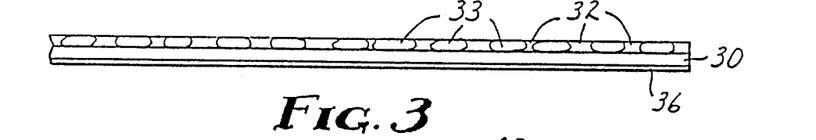
FIG. 3 is an edge view of a third embodiment.

The tape of FIG. 3 has an electrically-conductive metal foil backing 30 carrying a layer of hot-tackifying adhesive 32 containing a plurality of electrically-conductive metal particles 33 which preferably are flat as indicated and may have a thickness approximating the overall thickness of the adhesive layer 32. Tapes containing such particles are taught in the aforementioned U.S. Pat. No. 3,475,213. No adhesion-promoting primer layer is required inasmuch as the hot-tackifying adhesive layer of the invention tends to adhere strongly to metal backings, but there is a low-adhesion backsize coating 36 to permit unwinding from a roll.

Figure 4:
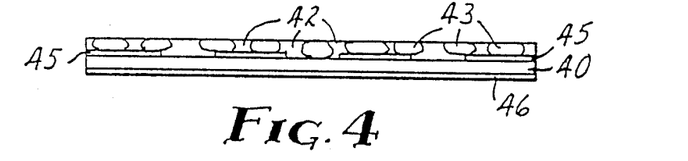
FIG. 4 is an end view of a fourth embodiment.

The tape of FIG. 4 has a plastic film backing 40 and a layer of hot-tackifying adhesive 42 containing flat electrically-conductive metal particles 43 comparable to the metal particles 33 of FIG. 3. The adhesive face of the backing 40 bears four electrically-conductive stripes 45 which may be metal and preferably are thin films and hence of negligible thickness. The opposite face of the backing 40 has a low-adhesion backsize coating 46.

Figure 5:
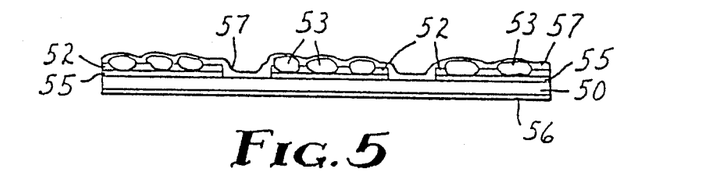
FIG. 5 is an end view of a fifth embodiment.

The tape of FIG. 5 has a plastic film backing 50 bearing three electrically-conductive stripes 55 similar to those of the tape of FIG. 4. Applied over each of the stripes 55 is a stripe of hot-tackifying adhesive 52 containing flat electrically-conductive metal particles 53, the thicknesses of which approximate twice the average dried thickness of the stripes of the adhesive 52. Applied over the adhesive 52 and the spaces between the stripes is a layer of unfilled hot-tackifying adhesive 57, the dried thickness of which approximates that of the adhesive 52. The uncoated face of the backing 50 has a low-adhesion backsize coating 56. When the tape of FIG. 5 is heated to a temperature at which the adhesive 57 becomes tacky and is laid against a rigid electrical conductor, pressure against the backing 50 produces electrical contact between the conductor and the conductive stripes 55, the excess adhesives 52 and 57 flowing into the spaces between the stripes.

Figure 6:
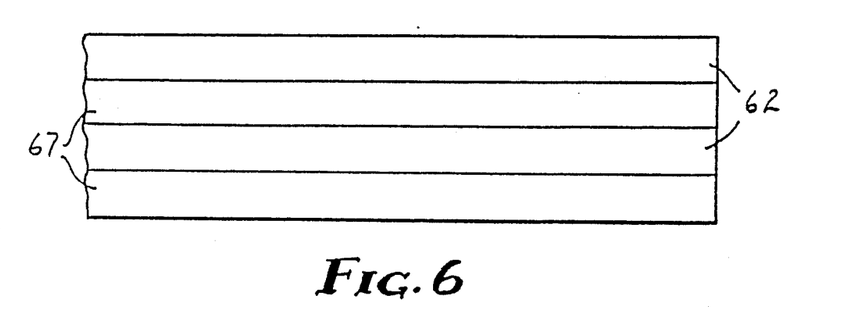
FIG. 6 shows the adhesive face of a sixth embodiment.

FIG. 6 shows the face of a tape having alternating longitudinal stripes of a hot-tackifying adhesive 62 and an ordinary pressure-sensitive adhesive 67 carried by a backing (not shown). The pressure-sensitive adhesive provides immediate bonding at room temperature, and the strength of the bond is appreciably increased by heating to a temperature at which the adhesive 62 becomes aggressively tacky. The heat-activated bond provided by the hot-tackifying adhesive 62 retains good strength upon subsequent exposure to temperatures at or somewhat above its bonding temperature. Instead of longitudinal stripes, the two types of adhesive could be applied in any desired pattern.

Figure 7:
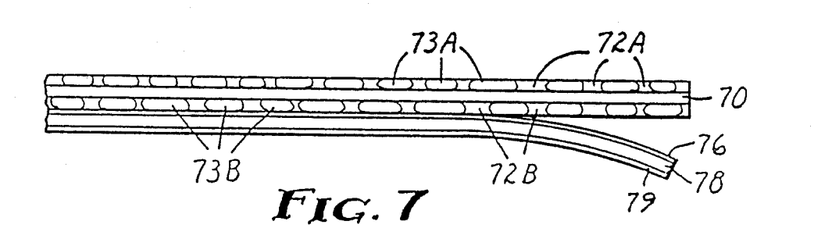
FIG. 7 is an edge view of a seventh embodiment.

FIG. 7 shows the edge of a tape having an electrically-conductive metal foil backing 70 and two layers of hot-tackifying adhesive 72A and 72B, each containing flat electrically-conductive metal particles 73A and 73B, respectively. The double-coated metal foil backing is supported by a disposable carrier web 78 which has low-adhesion surfaces, such as may be provided by a pair of low-adhesion coatings 76 and 79, and is shown being stripped away.

65° C. Shear Value

Heat a bright annealed stainless steel panel in an oven for 15 minutes at 115° C. above the weight-averaged Tg of the adhesive polymer. With the steel panel horizontal, adhere part of a tape 1.27 cm in width to the steel panel using a 2.04-kg hand roller conforming to Federal Standard 147, giving 2 passes in each direction. Trim the length of tape adhering to the panel to exactly 1.27 cm in length and leave this assembly at the bonding temperature for 15 minutes longer. Transfer the plate to an oven having a shear stand which allows a 2° backward tilt of the panel at its top (shear weight will force tape toward panel slightly). After 15 minutes at 65° C., hang a 1-kg weight from the free end of the tape. The time at which the weight falls is the 65° C. Shear Value. The test is discontinued if no failure has been detected after a prolonged period, usually 1100 or 1400 minutes.

In the following examples, all parts are given by weight, except as noted.

EXAMPLE 1

An acrylic terpolymer was made by mixing together 36 parts ethyl acrylate, 59 parts methyl acrylate, 5 parts acrylic acid, 286 parts ethyl acetate and 0.1 part azo-bis-isobutylnitrile ("vazo" 64 catalyst), purging the mixture with nitrogen to remove oxygen, and heating at 53°–55° C. for 16 hours to give 98–99% conversion to polymer. Weight-averaged Tg of this polymer was 0° C.

After diluting with ethyl acetate and adding 0.05 part isophthaloyl-bis(propylene imine) curing agent per 100 parts solids, this adhesive composition was coated onto one face of a biaxially-oriented polyethylene terephthalate film backing 25 micrometers thick, which face had an adhesion-promoting primer coating as described in U.S. Pat. No. 4,060,664. The opposite face of the film backing had a low-adhesion backsize coating as described in U.S. Pat. No. 2,532,011. After the acrylic polymer coating had been dried and cured a total of 6 minutes at temperatures ranging from 43° C. to 104° C. to provide a hot-tackifying adhesive tape of the invention, the tape was then slit to a width of 2.54 cm and wound upon itself for storage. The dried thickness of the adhesive layer was 30 micrometers. Test results are reported below:

| | |
|---|---|
| Bonding temperature used to prepare for testing 65° C. Shear value | 115° C. |
| 65° C. Shear Value in minutes | 1100+ |
| 10-second shear creep compliance at 23° C. | $2.2 \times 10^{-7}$ cm$^2$/dyne |
| 10-second shear creep compliance at bonding temperature | $2.9 \times 10^{-6}$ cm$^2$/dyne |
| 1000-second shear creep compliance at 100° C. | $1.2 \times 10^{-5}$ cm$^2$/dyne |

EXAMPLES 2–9

Additional acrylic terpolymers were made as in Example 1, except with monomer compositions as shown below:

| Example No. | 2 | 3 | 4 | 5 | 6 | 7 | 8 | 9 |
|---|---|---|---|---|---|---|---|---|
| Ethyl Acrylate | 68 | 40 | 4 | | | | | |
| Methyl Acrylate | 27 | 56 | 91 | 84.6 | 71.7 | | | |
| n-Butyl Methacrylate | | | | | | 83 | 68 | 75 |
| Methyl Methacrylate | | | | 10.4 | 23.3 | 10 | 25 | 25 |
| Acrylic Acid | 5 | 5 | 5 | 5 | | | | |
| Methacrylic Acid | | | | | | 7 | 7 | |
| Acrylamide | | | 4 | | | | | |
| Weight-averaged Tg in °C. | −10 | 0 | 10 | 20 | 30 | 35 | 46 | 37 |

Tapes were made as in Example 1 using the acrylic terpolymers of Examples 2–6 except that no curing agent was used in the adhesive composition of the tapes of Examples 3 and 9. The tapes of Examples 7–9 were likewise made as described in Example 1 except that the polyester film backing was replaced by dead-soft rolled copper foil (one ounce per square foot or 305 g/m2), a carrier web having low-adhesion surfaces was laid over the adhesive layer, and no curing agent was used in Example 9. Test results are reported below:

| Bonding Temperature | 115 | 115 | 125 | 135 | 145 | 155 | 165 | 155 |
|---|---|---|---|---|---|---|---|---|
| 65° C. Shear value | 1100+ | 97 | 1400+ | 1400+ | 1400+ | 1400+* | 1400+* | 1400+* |

-continued (minutes)

*Tested at 93° C.

Peel adhesions of the tapes of Examples 1 and 4–6 were determined per ASTM-D-1000, except that the stainless steel panel was preheated to the indicated bonding temperature, the roller was under full arm pressure and passed four times in each direction, and the adhesion was tested at the indicated test temperature. The peel adhesions are here reported in dynes per cm of width times $10^{-5}$.

| Bonding Temp °C. | 115 | 115 | 115 | 115 | 149 | 149 |
|---|---|---|---|---|---|---|
| Test Temp °C. | 65 | 121 | 132 | 143 | 163 | 174 |
| Example 1 | 5.1 | 6.4 | 7.3 | 5.1 | 1.5 | 0.5 |
| Example 4 | 5.0 | 5.8 | 6.6 | 5.8 | 2.5 | 0.9 |
| Example 5 | * | 4.9 | 5.0 | 5.0 | 3.2 | 2.1 |
| Example 6 | * | 4.4 | 3.8 | 5.3 | 5.1 | 2.6 |

*No adhesion; shocks off

The tape of Example 3 was also measured as follows:

| 10-second sheer creep compliance at 23° C. | $3.0 \times 10^{-7}$ cm$^2$/dyne |
|---|---|
| 10-second sheer creep compliance at bonding temperature (115° C.) | $3.0 \times 10^{-6}$ cm$^2$/dyne |
| 1000-second sheer creep compliance at 90° C. | $8.0 \times 10^{-6}$ cm$^2$/dyne |

EXAMPLE 10

A tightly woven glass cloth (Style 1290, Burlington Fabrics) was treated by squeeze rolls with a solution made by diluting the adhesive composition of Example 6 to 3% solids with ethyl acetate. Without drying, one face of the cloth was knife-coated with the adhesive composition of Example 1. This tape was dried and cured as in Example 1, then slit to a width of 1.27 cm and wound upon itself for storage. In spite of the adhesive nature of the composition of Example 6, it acted as if it were a low-adhesion backsize coating, thus enabling the tape to be unwound without delamination. After being unwound, it was tested with the following results:

| 65° C. Shear value | 370 minutes. |
|---|---|

EXAMPLE 11

A low-adhesion backsize coating was applied to one face of a carded fiber web ("Pellon" 7605) consisting of a compacted mixture of approximately 70 parts of drawn polyethylene terephthalate fibers and 30 parts amorphous polyethylene terephthalate fibers. To the other face was applied a coating of the adhesive composition of Example 1 followed by drying and curing for 3 minutes at 65° C. and then for 3 minutes at 104° C. A carrier web having low-adhesion surfaces was laid over the dried adhesive coating, and the whole was wound upon itself for storage.

| 65° C. Shear value | 1100+ minutes. |
|---|---|

Roll aging was simulated by first bonding at 115° C. a 2.54-cm wide strip of the tape to a steel plate and a 1.27-cm wide strip of the tape with its adhesive side against the backing of the first strip. A second steel plate was laid on the top strip, and weights were applied to exert a pressure of approximately 93 gf per cm$^2$ against the top strip. After 16 hours at 65° C. and cooling to room temperature, the top strip was readily peeled from the bottom strip without any delamination.

EXAMPLE 12

Fine silver spherical particles were sieved with Tyler sieves, and the cut passing 140 mesh (104 micrometer openings) and held on 170 mesh (89 micrometer openings) was selected. Of this selected powder, 77 g was mixed with 1000 g of vehicle (57 parts low-molecular-weight polyisobutylene and 43 parts mineral oil), flattened in a 3-roll paint mill, and the flattened metal particles were separated and washed with toluene to remove the vehicle. After drying, the silver particles were sieved so that the diameters in the widest direction were all over 104 micrometers. Microscopic examination showed that for this fraction, about 90% of the particles were substantially flattened, 5% were moderately flattened and 5% did not appear to be flattened. All had a thickness of approximately 70 micrometers.

An amount of the adhesive composition of Example 3 containing 100 parts of solids was mixed with 29.5 parts of the flattened silver particles plus 2.8 parts of disalicylalpropylene diamine (E. I. du Pont "Copper Inhibitor 50") and 2.4 parts of antioxidant. The mixture was then coated onto a low-adhesion carrier web and dried for a total of six minutes at temperatures ranging from 43° C. to 104° C. The thickness of the dried adhesive layer approximated that of the silver particles.

The silver-containing adhesive layer was transferred to dead-soft rolled copper foil (305 g/m$^2$) by rolling from the carrier side at 115° C.

| 65° C. Shear Value | 25 minutes. |
|---|---|

Resistance was measured by cutting out 1 cm square from a plastic film of 25 micrometers thickness, laying this against dead-soft copper foil, and laying the test tape over the cut-out, with adhesive side down. After heating to 170° C., pressing and cooling, resistance between the two copper foils was less than 0.001 ohm. After again heating at 90° C. for 16 hours, without applying pressure, and cooling to room temperature, the resistance was 0.001 ohm. All resistance tests were run without applying pressure.

EXAMPLE 13

The adhesive composition of Example 3 was diluted with ethyl acetate to 19% solids. Then 1 part of disalicylalpropylene diamine and 2.5 parts of antioxidant per 100 parts of adhesive solids were added. This adhesive composition was coated onto dead-soft rolled copper foil (305 g/m$^2$), dried, and interleafed with a carrier web having low-adhesion surfaces.

The carrier web was peeled off and substituted by a similar carrier web which was held in a taut condition and joined to the adhesive layer between the nip of two heated steel rolls. The roll contacting the carrier web was smooth, and the other roll had an embossing pattern consisting of 2 sets of raised fine lines on centers of 1.59 mm, the 2 sets being at right angles to each other, leaving a pattern of depressed squares on the embossing roll as illustrated in FIG. 3 of U.S. Pat. No. 3,497,383 (Olyphant, Jr. et al.). All the raised lines ran in a direction inclined 45° to the direction of rotation, so that diagonals of the squares were in the direction of rotation. While both rolls were at 280° C., they were pressed together with a gauge pressure of 2100 g/cm$^2$ distributed across the 25-cm wide web, thus creating the fine lines in the copper foil which reached the surface of the adhesive at the carrier web. The whole was slit to a width of 2.54 cm and wound up for storage. After peeling off the carrier web, the foil-backed tape was shown to effectively shield against radio-frequency signals without need for a clamp to hold it in place.

EXAMPLE 14

Fine annealed spherical copper particles were sifted to pass 200 mesh (74 micrometer openings) and be held on 230 mesh (63 micrometer openings) and then flattened and again sifted as in Example 12. About 85% of the particles were substantially flattened, 10% moderately flattened and 5% not flattened. All had a thickness of approximately 48 micrometers.

An amount of the adhesive of Example 3 containing 100 parts solids was mixed with 24 parts of the flattened copper particles plus 2.8 parts of disalicylalpropylene diamine and 2.4 parts of antioxidant. This was coated onto dead-soft rolled copper foil (305 g/m$^2$) and dried 75 seconds at 57° C. and 75 seconds at 127° C. to a thickness approximating that of the copper particles. A disposable carrier web having low-adhesion surfaces was laid over the dried coating, and the whole was slit to widths of 2.5 cm and wound up for storage.

| | |
|---|---|
| 65° C. Shear value | 34 minutes |
| Resistance, fresh (as in Example 12) | below .001 ohm per cm$^2$ |
| Resistance, aged 16 hours at 90° C. and cooled | .001 ohm per cm$^2$ |

EXAMPLE 15

Biaxially-oriented polyethylene terephthalate film which had 53% shrinkage in the lengthwise direction when heated to 150° C. was primed and backsized as in Example 1. It was then coated on the primed side with the adhesive of Example 1, and dried 6 minutes at 65° C., higher temperatures being avoided to keep from shrinking the film during drying. This was slit to tapes 2.54 cm in width which were wound upon themselves. A steel gear, 1.27 cm wide by 3.02 cm in diameter at the tips of the teeth and 2.11 cm in diameter between the teeth, was heated to 70° C. and wrapped circumferentially with the tape to provide a 0.63 cm long overlap, ending on the flat face of a tooth. The wrapped gear was then heated with an air gun, shrinking the tape snugly around the gear, with the tape attached firmly and evenly to the sides of the gear.

| | |
|---|---|
| 65° C. Shear value | 1400+ minutes |

EXAMPLE 16

A hot-tackifying tape of the invention was made using as the backing biaxially-oriented polyethylene terephthalate film of 25 micrometers thickness which had been heat-treated to develop superior thermal dimensional stability. Metallic silver stripes were applied by vapor deposition to a thickness of 25 nm and a width of 0.89 mm on 1.78 mm centers.

An acrylic terpolymer was made as in Example 1, except that the monomer composition was 10.4 parts methyl methacrylate, 85.6 parts methyl acrylate, and 4.0 parts acrylamide. Its weight-averaged Tg was 20° C. The hot-tackifying acrylic terpolymer adhesive was mixed with flattened silver metal particles having diameters from 76 to 102 micrometers and thicknesses about 25 micrometers. The particles comprised about 8% by volume of the mixture which was coated through a mask in stripes in register with the vapor-deposited silver stripes. Each adhesive stripe was about 13 micrometers in thickness after drying. Then the hot-tackifying adhesive of Example 3 was coated uniformly over the entire striped face and dried to a thickness of about 13 micrometers. At the same time a low-adhesion backsize was applied to the other face of the tape. This was slit to widths of 2.54 cm, each tape having 17 pairs of silver metal stripes and silver-particle-filled adhesive stripes. The tapes were wound upon themselves into rolls.

A piece of the tape 3.7 cm in length was applied to an unheated printed circuit board using a press, the moving platen of which was preheated to 170° C. Each pair of stripes of the tape matched a conductive lead on the face of the circuit board (adhered length 0.6 cm). A pressure of 119 kgf/cm$^2$ was applied for 5 seconds. The other end of the piece of tape was applied in the same way to an unheated indium-tin oxide coating on glass (adhered length 0.6 cm). After cooling to room temperature, the average resistance per channel was 237 ohms. After aging at 90° C. for 619 hours and cooling to room temperature, the resistance per channel increased to 350 ohms. This rather modest increase in resistivity suggests that good electrical conductivity should be retained after prolonged periods of use during which the adhesive may become rather warm due to electrical conduction and other phenomena.

The outer adhesive material, because of its lower Tg, enables adhesive bonding at lower temperatures than would an adhesive layer composed only of the inner adhesive material. However, the presence of the inner adhesive material enhances high-temperature performance.

EXAMPLE 17

A resist solution was made by mixing 800 grams of polystyrene resin, 160 grams of dioctylphthalate, 1222 grams of toluene, 2 grams of oil soluble blue dye, and 6 grams of oil soluble yellow dye. This solution was coated through a mask with slots, each 0.53 mm wide on 1.79 mm centers, onto unprimed, backsized, biaxially-oriented polyethylene terephthalate film 25 micrometers thick which had been heat-treated to develop superior thermal dimensional stability. After drying to provide a striped resist pattern, about 5 nm of silver were deposited by vapor coating, covering both the resist stripes and the spaces between them. The resist was then pulled away, leaving a pattern of vapor-deposited silver stripes. The striped polyester film was then heated for 10 minutes at 150° C. to anchor the silver more securely.

A solution of the adhesive of Example 3 was diluted to 25% solids, and mixed with small amounts of oil-soluble dyes plus 2.96 parts disalicylalpropylene diamine and 2.6 parts antioxidant per 100 parts adhesive solids. Just before coating, this was mixed with 50.2 parts per 100 parts adhesive solids of flattened spherical silver that passed through a 140 mesh Tyler sieve (104 micrometer openings) and was retained on a 200 mesh Tyler sieve (74 micrometer openings). While being stirred vigorously, this was coated onto the silvered side of the polyester film using the same mask to apply an adhesive stripe over each silver stripe. After drying, the double-striped tape was wound up with a liner for storage. Its adhesive stripes were between 25 and 30 micrometers thick and silver particles protruded above the mean adhesive surface 6 to 13 micrometers. The silver particles comprised about 4.8 volume percent of the adhesive layer. Peel adhesion from glass according to ASTM D-1000 (except for substrate and bonding method) was between 5.2 and 7.9 $\times 10^{-5}$ dynes per cm of width (including gaps between the adhesive stripes).

The tape was tested by bonding it (as in Example 16 except at 4.2 kgf/cm$^2$) to a circuit board which had 17 channels provided by strips of solder-covered copper foil, each about 0.9 mm wide on 1.79 mm centers. There was a 2.54 cm gap in the lengthwise direction in these strips, and the tape was applied so that each pair of adhesive and vapor-coated stripes bridged the gap in each strip of copper foil.

The following test results are averages of measuring each of the 17 channels at room temperature:

After 6000 hours at 70° C., resistance per channel rose from an average initial value of 8 ohms to an average of 13 ohms.

After thermal cycling for 6000 hours between −40° C. and 70° C., using a 4-hour cycle, with one hour at each temperature and 2 hours at intermediate temperatures, resistance per channel rose from 7.5 ohms initially to 14 ohms.

After a humidity soak for 6000 hours at 90% relative humidity and 50° C., resistance rose from an initial value of 7.5 ohms to 14 ohms.

EXAMPLE 18

Biaxially-oriented polyethylene terephthalate film was primed and backsized as in Example 1, and then coated in stripes with a solution of the hot-tackifying acrylic terpolymer of Example 16 containing blue dye. The stripes were each approximately 0.89 mm wide, on 1.78 mm centers. After drying, a solution of a pressure-sensitive adhesive was coated in stripes between the stripes of the adhesive terpolymer. The pressure-sensitive adhesive comprised by weight 44.2% natural rubber, 8.84% ZnO, 1.87% carbon black, 8.84% wood rosin, 26.52% polyterpene resin softening at 115° C., 8.84% heat-reactive phenolic resin and 0.88% antioxidant. After drying of the pressure-sensitive adhesive coating, the resultant tape was slit and wound into rolls 2.54 cm wide.

Peel adhesions determined according to ASTM D-1000 (except for application and testing temperatures) were:

| | |
|---|---|
| Applied at 20° C., tested at 20° C. | 340 gf/cm |
| Applied at 115° C., tested at 20° C. | 1248 gf/cm |
| Applied at 115° C., tested at 65° C. | 817 gf/cm |

EXAMPLE 19

Biaxially-oriented polyethylene terephthalate polyester film 25 micrometers in thickness was heat-treated to develop superior thermal dimensional stability. Silver stripes were vapor-deposited 0.89 mm wide and approximately 100 nm thick.

Into a solution of the adhesive of Example 3 was mixed per 100 parts adhesive solids 8 parts by volume of flattened silver particles, 76 micrometers to 102 micrometers in diameter and approximately 25 micrometers thick. While being stirred vigorously, this was coated onto the silvered side of the polyester film to a dried thickness of approximately 25 micrometers.

A piece of the resulting hot-tackifying adhesive tape 3.1 cm in length was bonded at one end to a conductive indium-tin oxide coating on glass and at the other end to a printed circuit board (as in Example 16 except at 11.9 kg/cm$^2$). The board had electrically conductive channels at the same spacing as the vapor-coated stripes of the tape so that each adhesive stripe connected one channel to the indium-tin oxide coating through 2.54 cm of unbonded tape. Initial resistance per channel through the two adhesives bonds was 255 ohms at room temperature. After 431 hours at 90° C., the resistance at room temperature was 437 ohms.

EXAMPLE 20

Used in this Example was a carrier web having low-adhesion surfaces, one having greater affinity to acrylate adhesives than the other. The adhesive composition of Example 1 was coated over the surface of greater affinity and dried and cured 2 minutes at 50° C., 2 minutes at 80° C. and 4 minutes at 95° C. After cooling, this hot-tackifying adhesive tape was slit to widths of 1.27 cm and wound up for storage.

The adhesive layer was transferred to dead-soft rolled copper foil (305 g/m$^2$) by rolling from the carrier side at 115° C. The resulting copper-foil backed tape was tested as follows:

| | |
|---|---|
| 65° Shear value | 1100+ minutes |

EXAMPLE 21

Example 21 was a tape made according to the tape of Example 1. The dried adhesive thickness of the tape of Example 21 was 33 micrometers.

COMPARATIVE EXAMPLE A

Comparative Example A was a tape made according to Example 21 except that the 0.05 part isophthaloyl-bis(propylene imine) external curing agent per 100 parts of polymer solids was not added to the adhesive composition. The dried adhesive thickness was 30.5 micrometers.

COMPARATIVE EXAMPLE B

Comparative Example B was made using the same procedure as in Example 21. The adhesive composition for this example was a tetrapolymer made by mixing together 36 parts ethyl acrylate, 58.75 parts methy acrylate, 0.25 part glycidyl methacrylate, and 5 parts acrylic acid. The adhesive composition was polymerized as in Example 1. The external curing agent was not added to this composition and 0.25 part methyl acrylate was replaced with 0.25 part glycidyl methacrylate, an internal curing agent. The adhesive thickness was 30.5 micrometers.

COMPARATIVE EXAMPLE C

Comparative Example C was a tape made according to the teachings of Hori. A mixture of butyl acrylate, acrylic acid and vinyl acetate (in a ratio of 70:1:29) was solution polymerized as a 48% solution of monomers in toluene. After adding 0.3 part azo-bis-isobutylnitrile (Vaso 64 catalyst), the mixture was purged with nitrogen to remove oxygen, heated at 53° C. for four hours, and further heated at 65° C. for 16 hours. To the mixture was added 0.3 part t-butyl perbenzoate, followed by a nitrogen purge and heating a 65° C. for 24 hours. The number average molecular weight was 135,000. The mixture was diluted with toluene to 35.16 solids. To make the Hori adhesive, 25.0 g of an epoxy resin (EPON 1004F available from Shell Chemical Corp. in the U.S. which is equivalent to the EPIKOTE #1004 sold by Shell Chemical Corp. outside the U.S.) was dissolved in 25.0 g of ethyl acetate. This solution was then added to 71 g of the acrylic resin mixture containing 25.0 g of solids. Finally, 0.25 g of cresol was mixed into the mixture yielding an adhesive according to Hori's Example 1. The adhesive was coated as in Example 21, except that the tape was dried at room temperature for 5 minutes, then at 100° C. for 5 minutes. Adhesive thickness was 33.0 micrometers.

COMPARATIVE EXAMPLE D

The tape of Example D was made with an adhesive according to the teachings of Guerin. The part A soft polymer has a 95:5 iso octyl acrylate and acrylic acid with a weight averaged Tg of −60° C. composition which was prepared according to Example 1 herein. The part B hard polymer was made using 98.5:1.5 isobutyl methacrylate and acrylic acid mixture with a weight averaged Tg of 48.7° C. which was polymerized. After 42 hours of polymerization, the part B polymer was 66% converted. The solution was mixed with a large excess of methanol in order to remove unreacted isobutyl methactylate monomer. This precipitated a polymer mass that was washed with fresh methanol. The polymer mass was dried with paper tissues, broken into small pieces, and redissolved in ethyl acetate. The adhesive was made by mixing 73.5 g of the soft polymer with 57.9 g of the hard polymer (a 60:40 ratio on a solids basis). The adhesive was coated as in Example 21 and dried for 3 minutes at 43° C., then at 104° C. for 3 minutes. Adhesive thickness was 30.5 micrometers. The adhesive film was clear, meeting Guerin's compatibility test.

Shear tests were run on the tapes of Examples 21, B, C, and D. The basic procedures for the 65° C. shear were followed while using varying cure cycles and test temperatures. The results are presented in Table I.

TABLE I

| CURE CONDITIONS | TEST TEMPERATURE | EXAMPLE 21 | A | B | C | D |
|---|---|---|---|---|---|---|
| None | 65° C. | 1100+ | 130 | 1100+ | .1 | .1 |
| 1 Hour 130° C. | 65° C. | | | | .9 | |
| 2 Hours 130° C. | 65° C. | | | | 975 | |
| 4 Hours 130° C. | 65° C. | | | | 1100+ | |
| 1 Hour 100° C. | 100° C. | 1172+ | 17 | 1172+ | .1 | |
| 2 Hours 100° C. | 100° C. | 1172+ | 15 | 1172+ | .1 | .1 |
| None | 130° C. | 152 (Ave. of 5) | | 1100+ (Ave. of 5) | | |
| 1 Hour 130° C. | 130° C. | 89 (Ave. of 5) | | 1070+ (Ave. of 5) | .1 | .1 |
| 2 Hours 130° C. | 130° C. | 27 (Ave. of 5) | | | | |

Comparison of shear value data for Examples 21, A, and B confirms that the adhesive composition of the present invention is substantially non-thermosettable and substantially non-crosslinkable.

Direct comparison of the shear values for Examples 21 and A indicate that during the drying stage there is some crosslinking provided by the external curing agent. However, the lack of significant increase in shear values after 1 or 2 hour cures at 100° C. and 130° C. further indicates that the adhesive composition of Example 21 is in essence non-thermosetting and non-crosslinking.

The presence of an internal curing agent is necessary in order for the adhesive composition of the present invention to exhibit crosslinking or thermosetting behavior. When the values for Examples 21 and B are compared, they are seen to have the same values in the absence of cure and after one or two hours at 100° C. cure and test temperatures. However, the shear values do not increase significantly for Example 21 at a 130° C. test temperature in the absence of cure and after cure at 130° C. for one and two hours, indicating that tapes according to the present invention are not thermosetting. The consistently high shear values for Example B under similar test conditions indicate that the tape of Example B with the internal curing agent is an example of a tape with a thermosetting adhesive and that in the absence of an internal curing agent the adhesive composition of the present invention is substantially non-thermosetting.

Comparison of the shear values for Example C (Hori) and Example D (Guerin) with the values for Example 21 clearly demonstrates the superior performance of the adhesive composition of the present invention over the adhesives of Hori and the preferred adhesive of Guerin.

I claim:

1. Heat-activatable substantially non-thermosettable, substantially non-crosslinkable adhesive tape that can be wound upon itself in roll form for convenience in storage and use and comprises a heat-resistant flexible backing and an adhesive layer which is nontacky or poorly tacky at 20° C., said adhesive layer comprises an acrylic polymer of acrylic ester monomer and is free of a reactive hot-melt resin, wherein the improvement comprises:

(1) said acrylic ester monomer provides at least 50 mol percent of the acrylic polymer of said adhesive layer, (2) said acrylic polymer has a Tg or a weightaveraged Tg of from −10° C. to 80° C., and (3) said adhesive layer has a Shear value of at least 25 minutes at 65° C., said adhesive layer adheres well to a clean substrate upon contact when heated to a temperature about 50° C. above the Tg or weight-averaged Tg of said acrylic polymer.

2. Heat-activatable adhesive tape as defined in claim 1 wherein said adhesive layer comprises an acrylic copolymer of monomers, up to 50 mol % of which is at least one copolymerizable polar monomer selected from acrylic acid, methacrylic acid, itaconic acid, maleic acid, maleic anhydride, amides of said acids, acrylonitrile, methacrylonitrile, and N-vinyl-2-pyrrolidone.

3. Heat-activatable adhesive tape as defined in claims 1 or 2 wherein the adhesive is filled with electrically-conductive particles comprising 0.1 to 40 volume percent of the adhesive layer.

4. Heat-activatable adhesive tape as defined in claim 3 wherein said backing is an electrically-conductive metal foil.

5. Heat-activatable adhesive tape as defined in claim 3 wherein said backing is a plastic film, and a plurality of narrow, parallel electrically-conductive stripes overlay the plastic film and underlay and contact said adhesive layer.

6. Heat-activatable adhesive tape as defined in claim 5 wherein said adhesive layer is in stripes overlying each electrically-conductive stripe, and a second unfilled heat-activatable adhesive layer covers the adhesive stripes and the spaces therebetween, the electrically-conductive particles having thicknesses approximating the total thickness of the two adhesive layers.

7. Heat-activatable adhesive tape as defined in claims 1 or 2 wherein said acrylic ester monomer is selected from alkyl acrylates having 1–8 carbon atoms in their alkyl groups, alkyl methacrylates having 1–8 carbon atoms in their alkyl groups, bornyl acrylates, bornyl methacrylates, 2-phenoxythyl acrylate, 2-phenoxyethyl methacrylate, the mono- and di-methyl and ethyl esters of itaconic acid, and the mono- and di-methyl and ethyl esters of maleic acid.

8. Heat-activatable adhesive tape as defined in claims 1 or 2 wherein styrene, vinyl acetate and vinyl chloride comprise up to 5 mol % of the total monomers.

9. Heat-activatable adhesive tape as defined in claims 1 or 2 wherein said backing is a plastic film and there is an adhesion-promoting primer layer between the adhesive layer and the plastic film.

10. Heat-activatable adhesive tape as defined in claim 9 wherein the plastic film is heat-shrinkable in the lengthwise direction.

11. Heat-activatable adhesive tape as defined in claims 1 or 2 wherein said backing is an electrically-conductive metal foil, the adhesive layer is in contact with one face of the metal foil, and there is a low-adhesion backside coating on the other face of the metal foil.

12. Heat-activatable adhesive tape as defined in claims 1 or 2 wherein said backing is a conductive metal foil and a carrier web having low-adhesion surfaces protects the adhesive layer.

13. Heat-activatable adhesive tape as defined in claim 12 wherein the foil extends in a pattern of lines and/or dots to the surface of the adhesive layer which becomes exposed upon removal of the carrier web.

14. Heat-activatable adhesive tape as defined in claims 1 or 2 wherein said backing is a fibrous web, the adhesive is mechanically interlocked with the fibers at one face of the backing.

15. Heat-activatable adhesive tape as defined in claim 14 wherein the backing comprises woven glass fibers.

16. Heat-activatable adhesive tape as defined in claim 14 wherein the backing comprises a web of nonwoven fibers.

17. Heat-activatable adhesive tape as defined in claims 1 or 2 wherein said backing has low-adhesion surfaces so that the adhesive layer can be removed from the backing.

18. Heat-activatable adhesive tape as defined in claim 17 wherein the adhesive is filled with electricallyconductive particles comprising 0.1 to 40 volume percent of the adhesive layer.

19. Heat-activatable adhesive tape as defined in claims 1 or 2 wherein said adhesive layer consists of spaced stripes of said polymer.

20. Heat-activatable adhesive tape as defined in claim 19 wherein said backing is a plastic film, there is an electrically-conductive stripe underlying each adhesive stripe, and the adhesive is filled with electrically-conductive particles comprising 0.1 to 40 volume percent of the adhesive layer.

21. Heat-activatable adhesive tape as defined in claim 19 wherein the spaces between said spaced stripes are filled with stripes of a pressure-sensitive adhesive.

* * * * *